United States Patent
Kajii

(10) Patent No.: US 9,196,492 B2
(45) Date of Patent: Nov. 24, 2015

(54) METHOD FOR MANUFACTURING SEMICONDUCTOR DEVICE

(71) Applicant: SUMITOMO ELECTRIC DEVICE INNOVATIONS, INC., Yokohama-shi, Kanagawa (JP)

(72) Inventor: Kiyoshi Kajii, Yokohama (JP)

(73) Assignee: SUMITOMO ELECTRIC DEVICE INNOVATIONS, INC., Yokohama-shi (JP)

( * ) Notice: Subject to any disclaimer, the term of this patent is extended or adjusted under 35 U.S.C. 154(b) by 255 days.

(21) Appl. No.: 13/661,471

(22) Filed: Oct. 26, 2012

(65) Prior Publication Data

US 2013/0109168 A1 May 2, 2013

(30) Foreign Application Priority Data

Oct. 26, 2011 (JP) ................. 2011-235436

(51) Int. Cl.
| | | |
|---|---|---|
| H01L 21/28 | (2006.01) | |
| H01L 27/02 | (2006.01) | |
| H01L 29/66 | (2006.01) | |
| H01L 29/778 | (2006.01) | |
| H01L 29/20 | (2006.01) | |

(52) U.S. Cl.
CPC ...... *H01L 21/28264* (2013.01); *H01L 27/0207* (2013.01); *H01L 29/2003* (2013.01); *H01L 29/66462* (2013.01); *H01L 29/778* (2013.01)

(58) Field of Classification Search
CPC ...... H01L 21/266; H01L 29/452; H01L 29/47
USPC .................................. 438/172, 605
See application file for complete search history.

(56) References Cited

U.S. PATENT DOCUMENTS

| | | | | |
|---|---|---|---|---|
| 5,567,647 | A * | 10/1996 | Takahashi | 438/573 |
| 5,925,901 | A * | 7/1999 | Tsutsui | 257/276 |
| 6,020,613 | A | 2/2000 | Udomoto et al. | |
| 6,023,086 | A * | 2/2000 | Reyes et al. | 257/341 |
| 6,255,679 | B1 * | 7/2001 | Akiba | 257/284 |
| 6,774,449 | B1 * | 8/2004 | Nishii et al. | 257/449 |

FOREIGN PATENT DOCUMENTS

| | | |
|---|---|---|
| JP | 5-275373 A | 10/1993 |
| JP | 08-316744 A | 11/1996 |
| JP | 11-103072 A | 4/1999 |
| JP | 2000-22089 A | 1/2000 |

OTHER PUBLICATIONS

Office Action dated Sep. 8, 2015, issued in counterpart Japanese Application No. 2011-235436, with English translation (6 pages).

\* cited by examiner

*Primary Examiner* — Julia Slutsker
(74) *Attorney, Agent, or Firm* — Westerman, Hattori, Daniels & Adrian, LLP

(57) ABSTRACT

A method for manufacturing a semiconductor device includes: forming a metal layer on a semiconductor layer; forming a plated layer having a pattern corresponding to a pattern of a gate bus line which couples each gate finger of a plurality of FETs on the metal layer, the pattern corresponding to the pattern of the gate bus line having a deficient part; forming a mask layer which covers the metal layer exposed in the deficient part; and patterning the metal layer by using the plated layer and the mask layer as a mask.

9 Claims, 8 Drawing Sheets

A-A CROSS SECTION

B-B CROSS SECTION

CROSS SECTION OF GATE FINGER

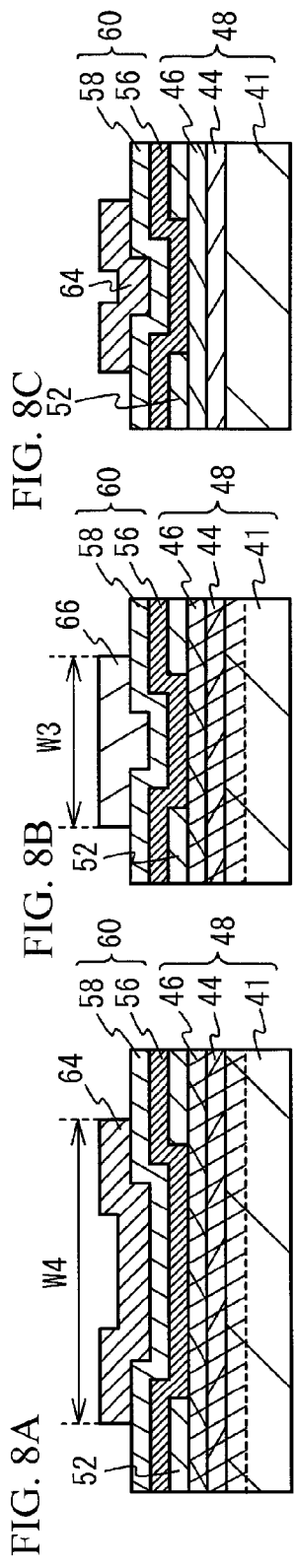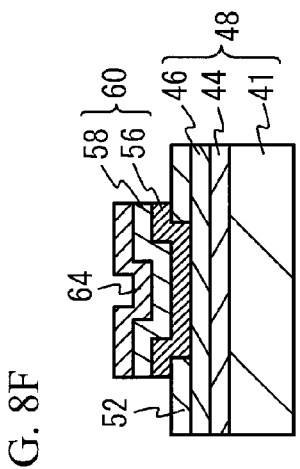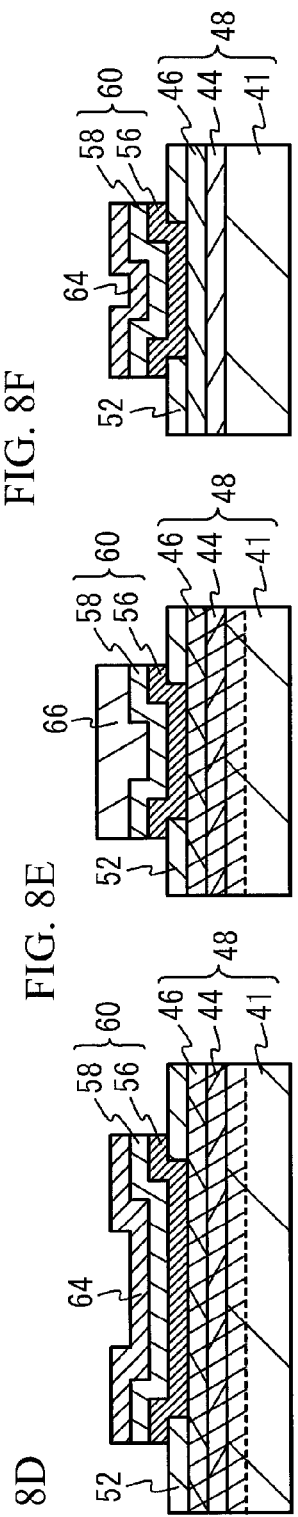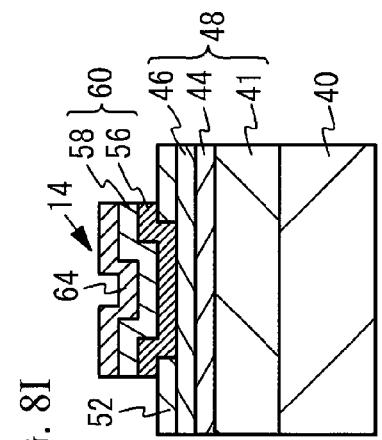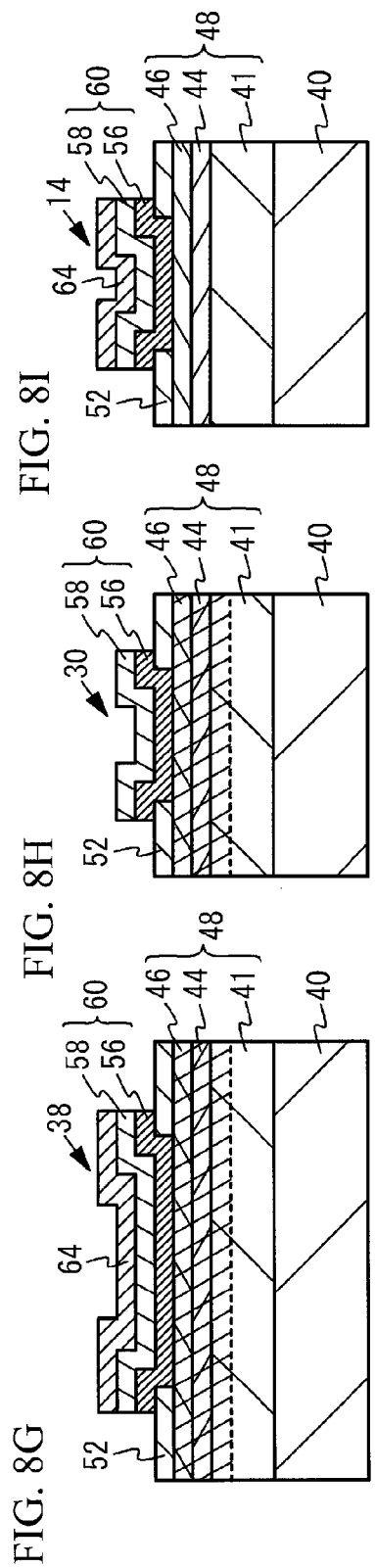

METHOD FOR MANUFACTURING SEMICONDUCTOR DEVICE

CROSS-REFERENCE TO RELATED APPLICATION

This application is based upon and claims the benefit of priority of the prior Japanese Patent Application No. 2011-235436, filed on Oct. 26, 2011, the entire contents of which are incorporated herein by reference.

BACKGROUND (i) Technical Field

The present invention relates to a method for manufacturing a semiconductor device.

(ii) Related Art

There is known a FET (Field Effect Transistor) as a semiconductor device suitable for amplifying in a high frequency band of a micro wave, a quasi-millimeter wave, a millimeter wave or the like. It is supposed that an epi resistor or a chip resistor is electrically coupled between gate pads adjacent to each other in the FET in order to suppress a loop oscillation of an odd mode. Japanese Patent Application Publication No. 8-316744 discloses that an oscillation preventing circuit is provided in a gate bias circuit in order to suppress an oscillation caused by a leak current between a gate and a source.

SUMMARY

It is an object to provide a method for manufacturing a semiconductor device that is capable of suppressing a loop oscillation of an odd mode without an epi resistor or a chip resistor.

According to an aspect of the present invention, there is provided a method for manufacturing a semiconductor device including: forming a metal layer on a semiconductor layer; forming a plated layer having a pattern corresponding to a pattern of a gate bus line which couples each gate finger of a plurality of FETs on the metal layer, the pattern corresponding to the pattern of the gate bus line having a deficient part; forming a mask layer which covers the metal layer exposed in the deficient part; and patterning the metal layer by using the plated layer and the mask layer as a mask.

BRIEF DESCRIPTION OF THE DRAWINGS

FIG. 8A through FIG. 8I illustrate a schematic cross sectional view of the method for manufacturing the semiconductor device of the embodiment.

DETAILED DESCRIPTION

When a chip resistor is electrically coupled between gate pads adjacent to each other in order to suppress a loop oscillation of an odd mode, the number of component gets larger and it is necessary to secure a space for the chip resistor. When an epi resistor is electrically coupled between gate pads adjacent to each other, it is not possible to suppress the loop oscillation of the odd mode unless an area of the epi resistor is large. This is because it is preferable that the resistance for suppressing the loop oscillation of the odd mode is 10Ω or less such as 2 to 3Ω, although a sheet resistance of the epi resistor is high value such as 100 Ω/□.

Figure 1:
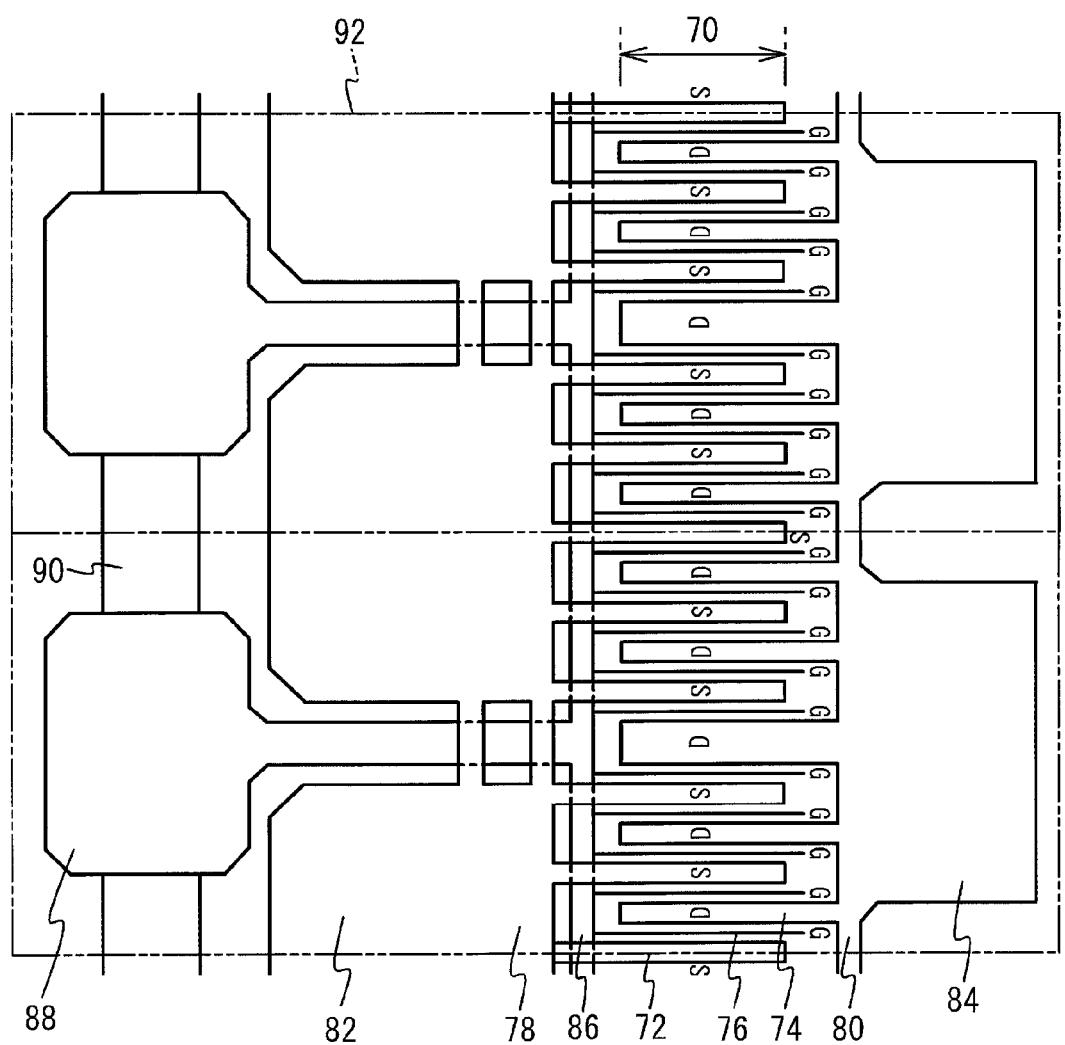
FIG. 1 illustrates a schematic top view of a semiconductor device in accordance with a comparative example.

A description will be given of a semiconductor device in accordance with a comparative example. In order to suppress a loop oscillation of an odd mode, the semiconductor device of the comparative example has a structure in which an epi resistor is electrically coupled between gate pads adjacent to each other. FIG. 1 illustrates a schematic top view of the semiconductor device of the comparative example. As illustrated in FIG. 1, a plurality of source fingers 72, a plurality of drain fingers 74 and a plurality of gate fingers 76 are provided on an active region 70 of a semiconductor layer formed on a semiconductor substrate. The active region is a region in which a source finger, a drain finger and a gate finger are provided and a semiconductor layer is electrically activated.

The plurality of source fingers 72 are coupled to each other by a source bus line 78. The plurality of drain fingers 74 are coupled to each other by a drain bus line 80. A plurality of source pads 82 are coupled to the source bus line 78. A plurality of drain pads 84 are coupled to the drain bus line 80.

The plurality of gate fingers 76 are coupled to each other by a gate bus line 86. A plurality of gate pads 88 are coupled to the gate bus line 86. An epi resistor 90 is electrically coupled between the gate pads 88 adjacent to each other. FETs in accordance with a cycle of the plurality of gate pads 88 act as a unit FET 92.

Figure 2:
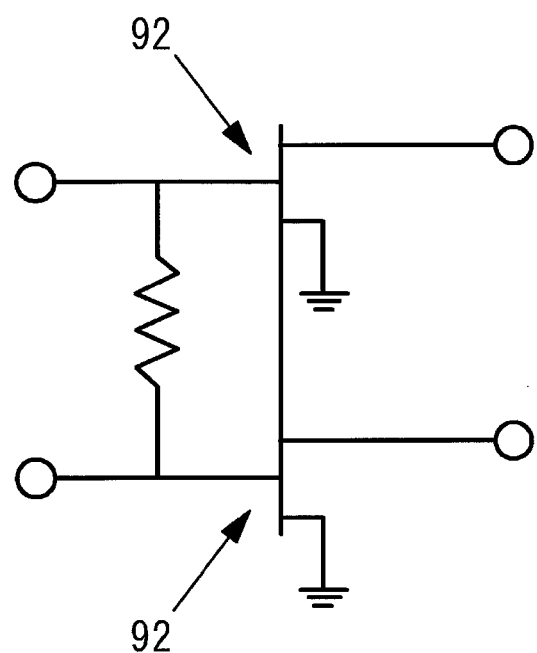
FIG. 2 illustrates an equivalent circuit diagram of the semiconductor device of the comparative example.

FIG. 2 illustrates an equivalent circuit diagram of the semiconductor device of the comparative example. As illustrated in FIG. 2, a resistor is provided between gates of the unit FETs 92 adjacent to each other. This is because the epi resistor 90 is electrically coupled between the gate pads 88 adjacent to each other as described with reference to FIG. 1. Thus, in accordance with the comparative example, it is possible to suppress a loop oscillation of an odd mode.

However, as described above, when a resistance of the epi resistor 90 is 10Ω or less in order to suppress the loop oscillation of the odd mode, an area of a resistor-activated region of the epi resistor 90 may be enlarged. Therefore, isolation between the resistor-activated region and the active region 70 of the FET is not established, and a gate leak current may occur. And so, a description will be given of a semiconductor device that is capable of suppressing a loop oscillation of an odd mode without an epi resistor.

First Embodiment

Figure 3:
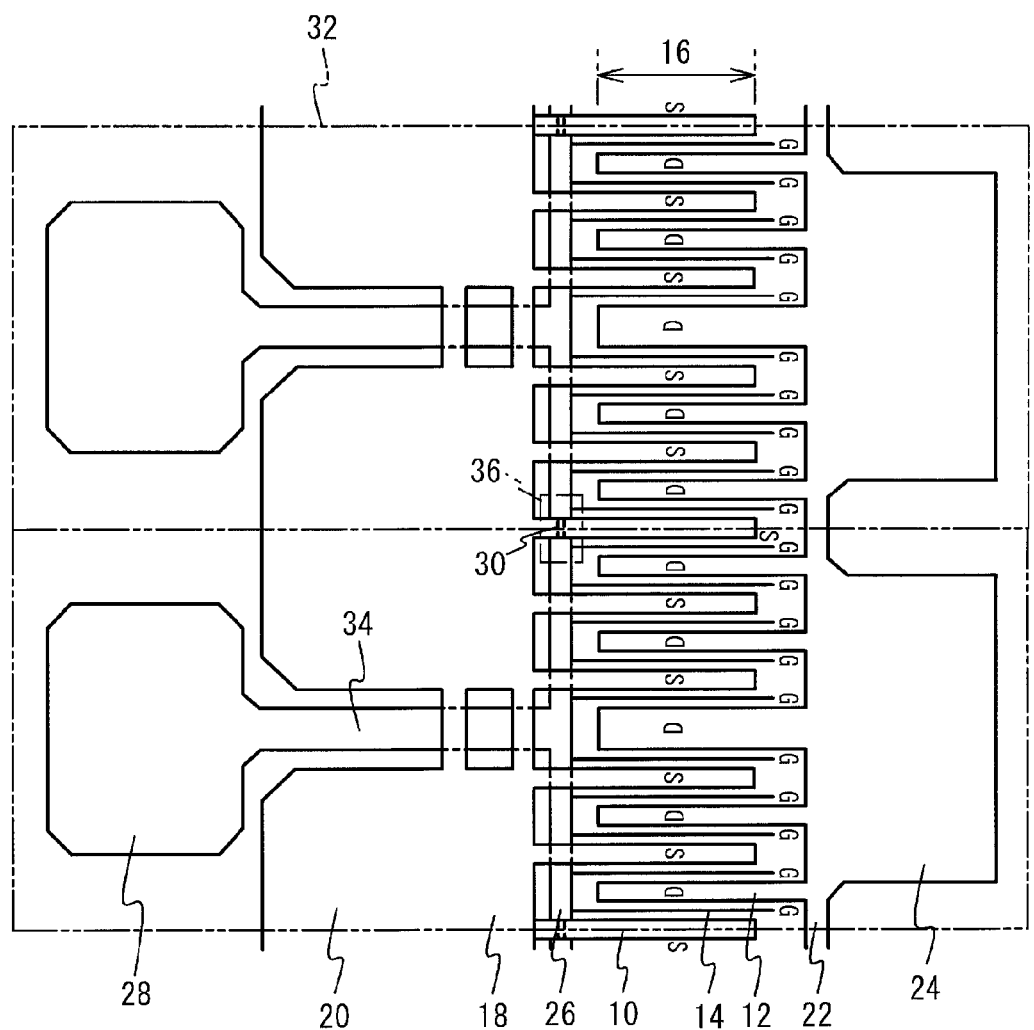
FIG. 3 illustrates a schematic top view of a semiconductor device in accordance with an embodiment.

FIG. 3 illustrates a schematic top view of a semiconductor device in accordance with an embodiment. As illustrated in FIG. 3, a plurality of source fingers 10, a plurality of drain fingers 12 and a plurality of gate fingers 14 are provided on a semiconductor layer formed on a semiconductor substrate. The plurality of source fingers 10 are provided on an active region 16 in parallel with each other. The plurality of drain fingers 12 are provided on the active region 16 in parallel with each other and are arrayed alternately with the source fingers 10. The plurality of gate fingers 14 are provided on the active region 16 in parallel with each other. Each of the gate fingers 14 is located between the source finger 10 and the drain finger 12. Thus, a plurality of FETs, in which the gate finger 14 is sandwiched by the source finger 10 and the drain finger 12, are coupled in parallel.

The plurality of source fingers 10 are coupled to each other by a source bus line 18 on an outer side of the active region 16. A plurality of source pads 20 are coupled to the source bus line 18 at an equal interval. Similarly, the plurality of drain fingers 12 are coupled to each other by a drain bus line 22 on an outer side of the active region 16. A plurality of drain pads 24 are coupled to the drain bus line 22 at an equal interval. The source bus line 18 and the source pad 20 are located at an opposite side of the drain bus line 22 and the drain pad 24 with respect to the active region 16.

The plurality of gate fingers 14 are coupled to each other by a gate bus line 26 on an outer side of the active region 16. A plurality of gate pads 28 are coupled to the gate bus line 26 at an equal interval. The gate bus line 26 has a deficient part which is a small width portion 30 of which width is reduced, in a region extending toward the gate bus line 26 from between the gate pads 28 adjacent to each other. FETs in accordance with a cycle of the plurality of gate pads 28 act as a unit FET 32.

The gate bus line 26 and the gate pad 28 are provided on the same side as the source bus line 18 and the source pad 20 with respect to the active region 16. Therefore, a region where the source finger 10 and the gate bus line 26 intersect with each other has a structure in which an insulating film is provided between the source finger 10 and the gate bus line 26 or an air bridge structure having air between the source finger 10 and the gate bus line 26 so that the source finger 10 is not electrically coupled to the gate bus line 26. And, a region where an interconnection line 34 extracted from the gate bus line 26 to the gate pad 28 intersects with the source bus line 18 also has a structure in which an insulating film is provided between the interconnection line 34 and the source bus line 18 or an air bridge structure having air between the interconnection line 34 and the source bus line 18.

Figure 4A:
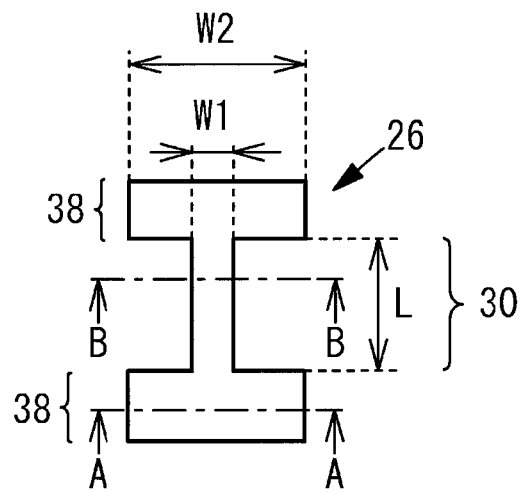
FIG. 4A illustrates a schematic top view of a gate bus line.
Figure 4B:
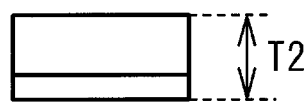
FIG. 4B illustrates a cross sectional view taken along a line A-A of FIG. 4A.
Figure 4C:
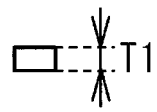
FIG. 4C illustrates a cross sectional view taken along a line B-B of FIG. 4A.
Figure 4D:
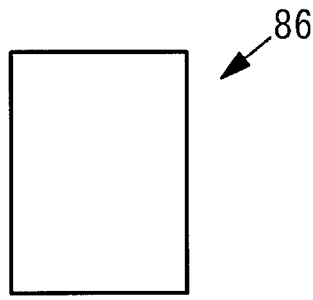
FIG. 4D illustrates a schematic top view of a gate bus line of the comparative example.

A description will be given of details of the gate bus line 26. FIG. 4A illustrates a schematic top view of the gate bus line 26 in a region 36 of FIG. 3. FIG. 4B illustrates a cross sectional view taken along a line A-A of FIG. 4A. FIG. 4C illustrates a cross sectional view taken along a line B-B of FIG. 4A. And, for comparison, FIG. 4D illustrates a schematic top view of the gate bus line 86 of the comparative example. As illustrated in FIG. 4D, in the comparative example, the gate bus line 86 extends with a constant width and a constant thickness. A width of the gate bus line 86 is, for example, 10 μm, and a thickness of the gate bus line 86 is, for example, 1 μm. On the other hand, As illustrated in FIG. 4A through FIG. 4C, in the embodiment, the gate bus line 26 has the small width portion 30 of which width is reduced. A length L of the small width portion 30 is, for example, 15 μm. A width W1 of the small width portion 30 is, for example, 1 μm. A thickness T1 of the small width portion 30 is, for example, 0.2 μm. A width W2 of a portion other than the small width portion 30 (hereinafter referred to as a large width portion 38) is, for example, 10 μm. A thickness T2 of the large width portion 38 is, for example, 1 μm.

Figure 5:
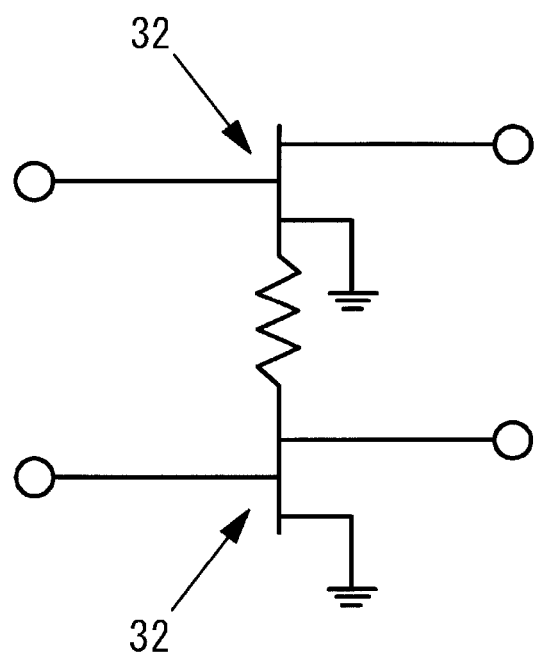
FIG. 5 illustrates an equivalent circuit diagram of the semiconductor device of the embodiment.

FIG. 5 illustrates an equivalent circuit diagram of the semiconductor device of the embodiment. As illustrated in FIG. 5, a resistor is provided between the unit FETs 32 adjacent to each other. This is because a resistance is high in the small width portion 30 because the small width portion 30 is provided in the gate bus line 26. If the gate bus line 26 is made of Au, the resistance of the small width portion 30 is approximately 2Ω when the length L, the width W1 and the thickness T1 of the small width portion 30 are respectively 15 μm, 1 μm and 0.2 μm. Thus, it is possible to suppress a loop oscillation of an odd mode.

Next, a description will be given of a method for manufacturing the semiconductor device of the embodiment, with reference to FIG. 6A through FIG. 8I. In FIG. 6A through FIG. 8I, a cross section corresponding to FIG. 4A taken along the line A-A, a cross section corresponding to FIG. 4A taken along the line B-B and a cross section of a region in which the gate finger is to be formed are used.

Figure 6A:
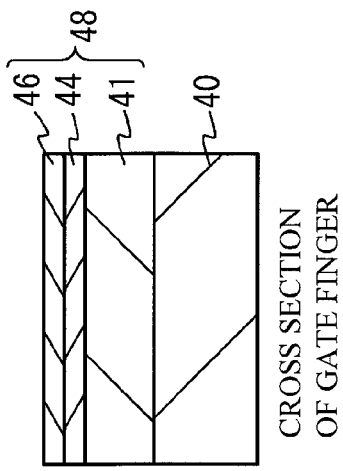
FIG. 6A through FIG. 6I illustrate a schematic cross sectional view of a method for manufacturing the semiconductor device of the embodiment.
Figure 6B:
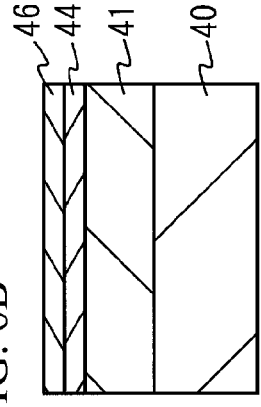
Figure 6C:
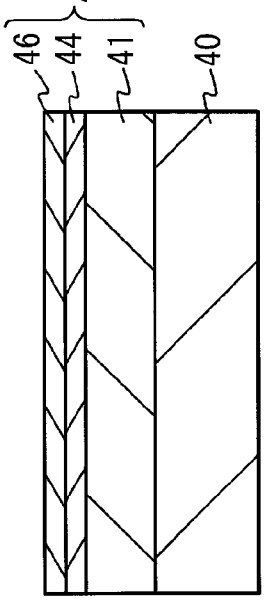

As illustrated in FIG. 6A thorough FIG. 6C, an i-type GaN layer 41, an n-type AlGaN layer 44 and an n-type GaN layer 46 are deposited in this order on a semiconductor substrate 40 made of a GaN substrate with use of a MOCVD (Metal Organic Chemical Vapor Deposition) method or the like. Thus, a semiconductor layer 48 including the i-type GaN layer 41, the n-type AlGaN layer 44 and the n-type GaN layer 46 is formed on the semiconductor substrate 40. In FIG. 6D through FIG. 8F, the semiconductor substrate 40 is omitted for simplification of illustration.

Figure 6D:
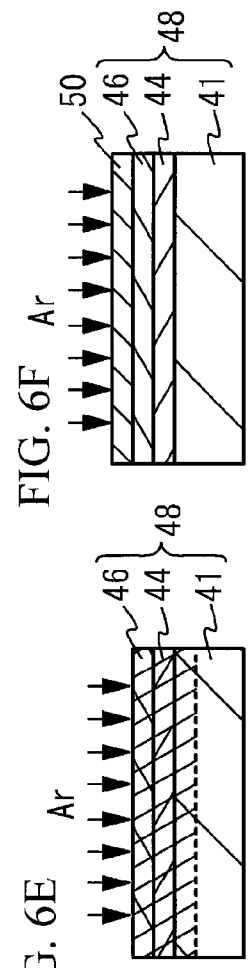
Figure 6E:
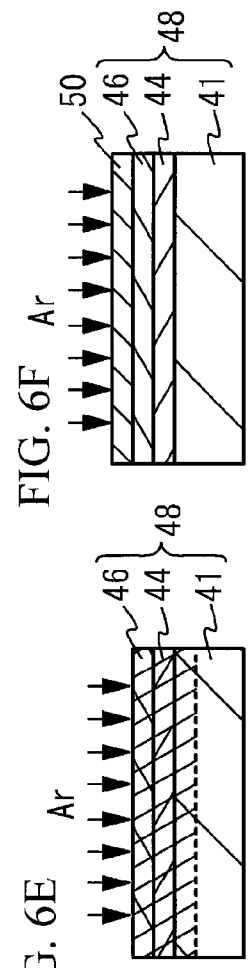
Figure 6F:
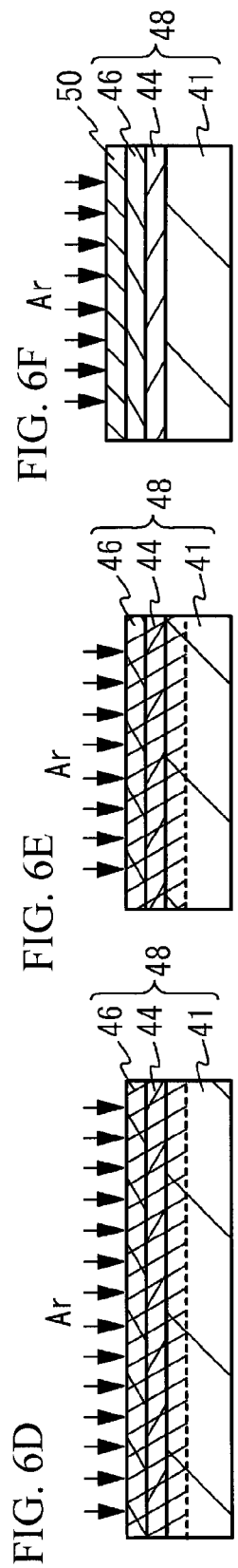

As illustrated in FIG. 6D through FIG. 6F, a region to be the active region 16 is covered with a mask layer 50 made of a resist or the like, and an Ar (argon) ion is injected into the region with use of the mask layer 50 as a mask. Thus, a region of the semiconductor layer 48 other than the region to be the active region 16 is inactivated.

Figure 6G:
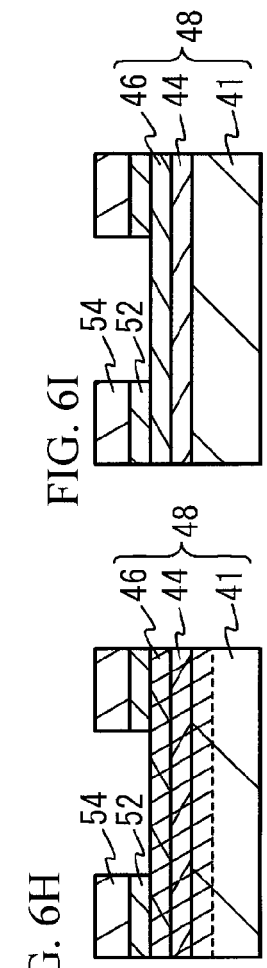
Figure 6H:
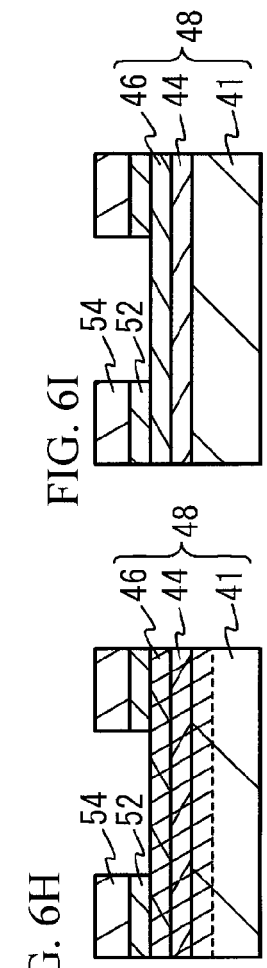
Figure 6I:
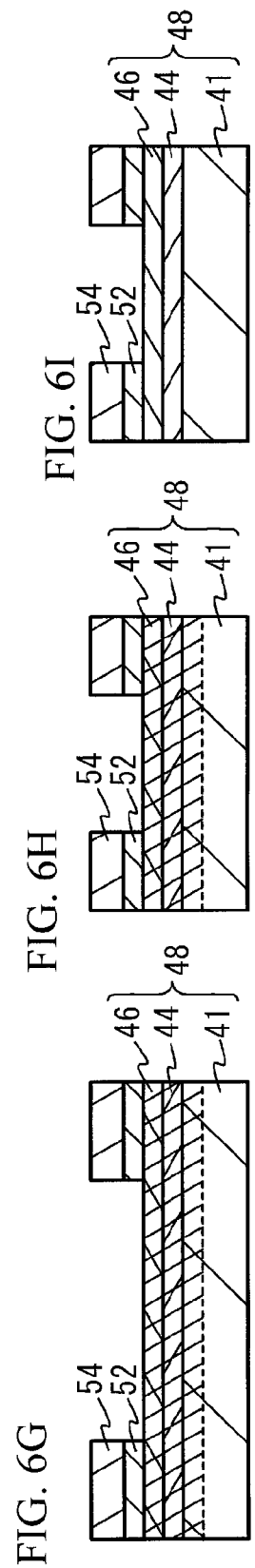

As illustrated in FIG. 6G through FIG. 6I, after removing the mask layer 50, a silicon nitride film 52 is deposited on the semiconductor layer 48 by a CVD (Chemical Vapor Deposition) method or the like. Next, a resist 54 is formed on the silicon nitride film 52. And, the resist 54 is subjected to a patterning so that a region of the silicon nitride film 52 where the gate finger 14 and the gate bus line 26 are to be formed is exposed. After the patterning, the silicon nitride film 52 is etched and removed by a dry etching method with use of the resist 54 as a mask.

Figure 7A:
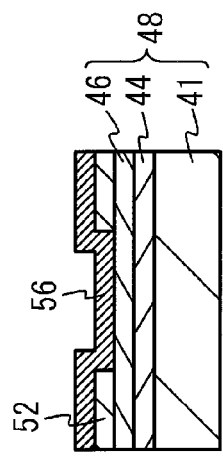
FIG. 7A through FIG. 7I illustrate a schematic cross sectional view of the method for manufacturing the semiconductor device of the embodiment.
Figure 7B:
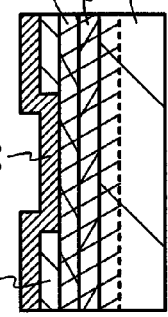
Figure 7C:
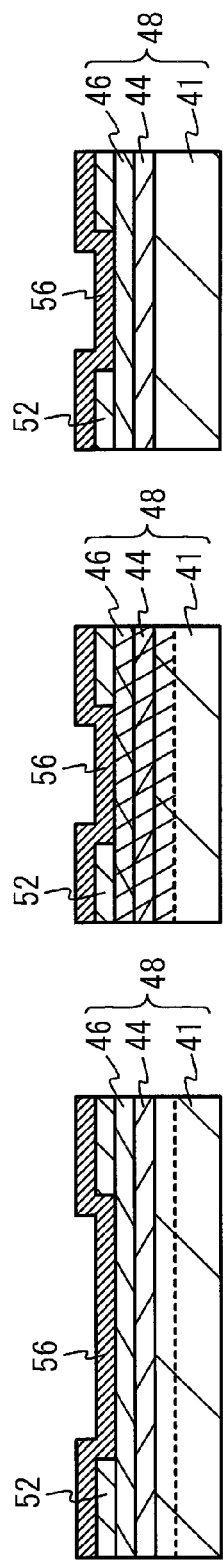
Figure 7D:
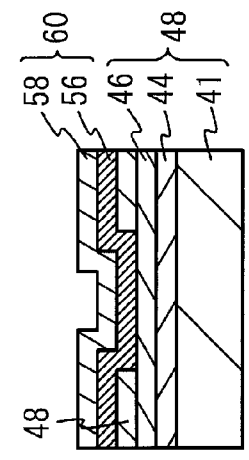
Figure 7E:
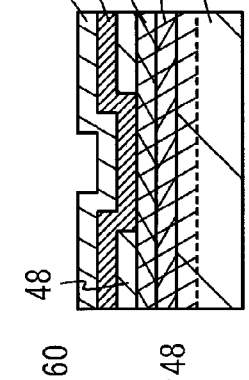
Figure 7F:
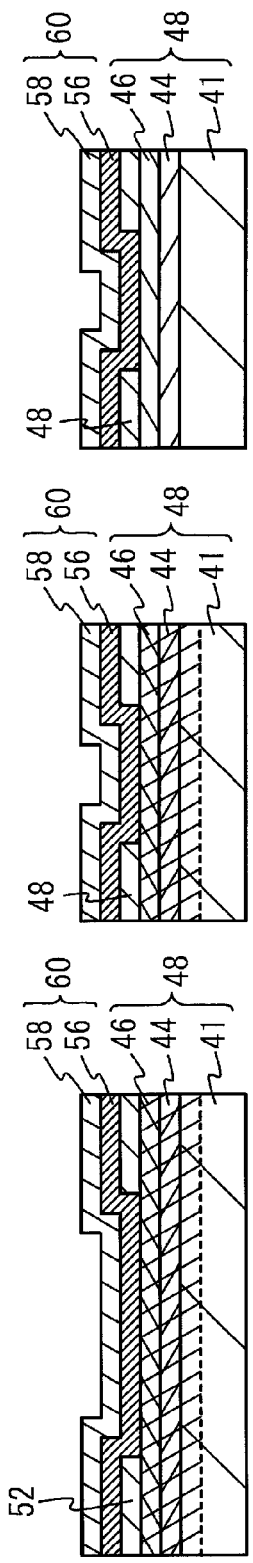

As illustrated in FIG. 7A through FIG. 7C, after removing the resist 54, a Ni (nickel) layer having a thickness of 50 nm and a Pd (palladium) layer having a thickness of 20 nm are deposited on the semiconductor layer 48 and the silicon nitride film 52 by a vacuum deposition method or the like. The Ni layer and the Pd layer act as a layer 56. As illustrated in FIG. 7D through FIG. 7F, an Au layer 58 having a thickness of 0.2 μm is deposited on the Pd layer of the layer 56 by a vacuum deposition method or the like. Thus, a metal layer 60 including the layer 56 including the Ni layer and the Pd layer and the Au layer 58 is formed on the semiconductor layer 48.

Figure 7G:
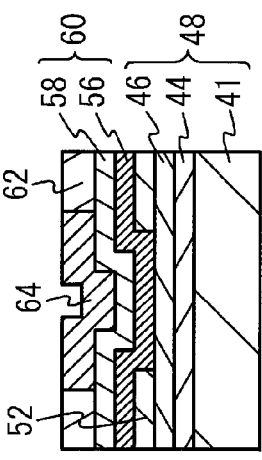
Figure 7H:
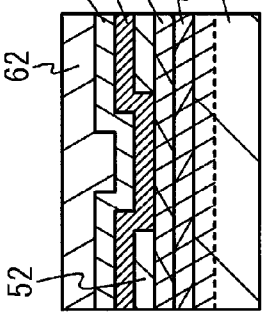
Figure 7I:
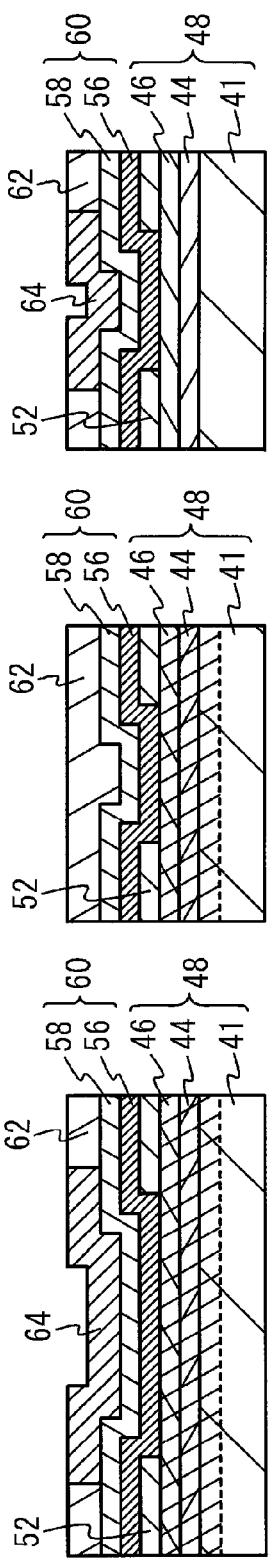

As illustrated in FIG. 7G through FIG. 7I, a resist is formed on the Au layer 58. The resist is subjected to a patterning and a first mask layer 62 is formed so that an opening is formed in a region where the large width portion 38 of the gate bus line 26 is to be formed and a region where the gate finger 14 is to be formed. That is, the first mask layer 62 is formed so that a region where the small width portion 30 of the gate bus line 26 is to be formed is covered and the region where the large width portion 38 is to be formed is opened. After that, a plated layer 64 made of Au having a thickness of 2 μm is formed by an electrolytic plating method or the like with use of the first mask layer 62 as a mask.

As illustrated in FIG. 8A through FIG. 8C, after removing the first mask layer 62, a resist is formed on the Au layer 58 and the plated layer 64 again. The resist is subjected to a patterning and a second mask layer 66 is formed so that the region of the gate bus line 26 where the small width portion 30 is to be formed. A width W3 of the second mask layer 66 is smaller than a width W4 of the plated layer 64 formed in the region where the large width portion 38 is to be formed.

As illustrated in FIG. 8D through FIG. 8F, the metal layer 60 is etched and removed by a dry etching method or the like with use of the plated layer 64 and the second mask layer 66 as a mask. Thus, a side face of the metal layer 60 and a side face of the plated layer 64 form an identical plane. As illustrated in FIG. 8G through FIG. 8I, the second mask layer 66 is removed. Thus, the gate bus line 26 having the small width portion 30 and the large width portion 38 is formed. And, the gate finger 14 is formed together with the gate bus line 26.

In accordance with the embodiment, as illustrated in FIG. 7A through FIG. 7F, the metal layer 60 is formed on the semiconductor layer 48. As illustrated in FIG. 8A and FIG. 8B, the plated layer 64 having a pattern corresponding to a pattern of the gate bus line 26 of which part is removed is formed. And, the second mask layer 66 covering the part and having a width smaller than the width of the gate bus line 26 in the region where the plated layer 64 is formed is formed. As illustrated in FIG. 8D and FIG. 8E, the metal layer 60 is subjected to a patterning with use of the plated layer 64 and the second mask layer 66 as a mask. Thus, the gate bus line 26 having the small width portion 30 is formed.

Thus, as illustrated in FIG. 5, it is possible to provided a semiconductor device that is capable of suppressing a loop oscillation of an odd mode without an epi resistor or a chip resistor. Therefore, increasing of the number of components caused by using of a chip resistor and an occurrence of gate leak current caused by using an epi resistor do not occur. And, as illustrated in FIG. 5, the resistor is not coupled in series with the gate, and the degradation of gain characteristic can be suppressed. And, a capacitance of the gate with respect to the ground can be reduced because the width of a part of the gate bus line 26 is reduced. Further, a phase balance between the unit FETs 32 is hardly degraded, the outputs of the unit FETs 32 have an identical phase, and combining efficiency of the outputs of the unit FETs 32 is increased, because the unit FETs 32 adjacent to each other are coupled with the shortest distance.

In order to suppress the loop oscillation of the odd mode, it is required that the resistance of the small width portion 30 in the gate bus line 26 is accurately adjusted to a low one such as 10Ω or less. For example, when a plated layer is also formed on the small width portion 30 and the metal layer 60 is removed with use of the plated layer as a mask, the plated layer of the small width portion 30 has to be removed at the end. In this case, the resistance of the small width portion 30 may fluctuate. In contrast, when the second mask layer 66 is formed on the region corresponding to the small width portion 30 without forming a plated layer and the metal layer 60 is removed with use of the second mask layer 66 as a mask as illustrated in FIG. 8B and FIG. 8E, the resistance of the small width portion 30 can be accurately adjusted to a low one. It is therefore possible to suppress the loop oscillation of the odd mode more certainly.

In FIG. 8A and FIG. 8D, in the region corresponding to the large width portion 38 of the gate bus line 26, the metal layer 60 is removed with use of the plated layer 64 as a mask without forming the second mask layer 66 on the plated layer 64. For example, when a resist is formed on the metal layer 60 so as to cover the plated layer 64 and the resist is remained on the plated layer 64 and the metal layer 60, an exposure focus is missed on the plated layer 64 and the metal layer 60 and the patterning gets more difficult because the plated layer 64 is thick. That is, it is difficult to accurately perform the patterning to the resist. Therefore, as illustrated in FIG. 8A and FIG. 8B, the patterning is performed so that the resist is remained only on the metal layer 60 without remaining the resist on the plated layer 64. Thus, the second mask layer 66 is formed. With the processes, the second mask layer 66 can be subjected to the patterning accurately, and the resistance of the small width portion 30 can be adjusted to a low one accurately. It is therefore possible to suppress the loop oscillation of the odd mode more certainly.

As illustrated in FIG. 7G and FIG. 7H, it is preferable that the first mask layer 62 having an opening having the pattern corresponding to the pattern of the gate bus line 26 of which part is removed, and the plated layer 64 is formed on the metal layer 60 with use of the first mask layer 62 as a mask.

As illustrated in FIG. 3, it is preferable that the small width portion 30 acting as a part of the gate bus line 26 is provided between the gate pads 28. This is because there is little influence on the characteristic even if the small width portion 30 is formed, because a current hardly flows in the gate bus line 26 between the gate pads 28 adjacent to each other. That is, the loop oscillation of the odd mode is suppressed while the influence on the characteristic is suppressed. It is therefore more preferable that the small width portion 30 is located so that electrical lengths from the small width portion 30 to the plurality of gate pads 28 are substantially equal to each other. That is, it is more preferable that electrical lengths from the gate pads 28 adjacent to each other to the small width portion 30 are equal to each other. This is because the loop oscillation of the odd mode can be suppressed while the influence on the characteristic can be suppressed, because a current hardly flows in the gate bus line 26 at a position where electrical lengths from the gate pads 28 are equal to each other.

As illustrated in FIG. 8A and FIG. 8D, the metal layer 60 is removed by an etching with use of the plated layer 64 as a mask. Therefore, the thickness of the plated layer 64 after the etching is smaller than that before the etching. It is preferable that the thickness of the plated layer 64 is 1 μm to 2 μm, and more preferably 1.2 μm to 1.8 μm, in view of the increasing of the resistance of the gate bus line 26 caused by the reduction of the thickness of the plated layer 64. It is preferable that the thickness of the plated layer 64 after the etching is 0.5 μm to 1 μm, and more preferably 0.7 μm to 0.8 μm.

As illustrated in FIG. 7A through FIG. 7F, it is preferable that the layer 56 (the Ni layer and the Pd layer) and the Au layer 58 acting as the metal layer 60 are laminated in this order from the semiconductor layer 48 side. As illustrated in FIG. 8D through FIG. 8F, it is preferable that the metal layer 60 is removed by the dry etching method with use of the plated layer 64 and the second mask layer 66 as a mask. When the metal layer 60 is removed by the dry etching method, the width of the gate bus line 26 can be accurately adjusted. That is, the width of the small width portion 30 can be accurately adjusted, and the resistance of the small width portion 30 can be accurately adjusted to a low one. In FIG. 7G and FIG. 7I, the plated layer 64 is formed by the electrolytic plating method. However, the plated layer 64 may be formed by an electroless plating method.

As illustrated in FIG. 7F, the metal layer 60 is also formed on the region where the gate finger 14 is to be formed. As illustrated in FIG. 7I, the plated layer 64 is formed so as to have the pattern of the gate finger 14. And, as illustrated in FIG. 8F, it is preferable that the metal layer 60 to be the gate finger 14 is subjected to a patterning with use of the plated layer 64 as a mask together with the forming of the gate bus line 26. That is, it is preferable that the gate bus line 26 and the gate finger 14 are formed together with each other in a single process. In this case, it is possible to form the gate bus line 26 and the gate finger 14 with fewer processes. And, the cost may be reduced. However, the process for forming the gate bus line 26 may be different from the process for forming the gate finger 14. In the embodiment, as illustrated in FIG. 3, the number of the small width portion 30 of the gate bus line 26 between the unit FETs 32 adjacent to each other is one. However, the structure is not limited. The number of the small width portion 30 may be two, three or the like.

In the embodiment, the gate bus line 26 has the small width portion 30 between the unit FETs 32 adjacent to each other. However, the structure is not limited. A resistor is added between the unit FETs 32 adjacent to each other by reducing the thickness of a part of the gate bus line 26. The gate bus line can be formed when a metal layer is formed on a semiconductor layer and the metal layer is subjected to a patterning with use of a plated layer having a pattern corresponding to the pattern of the gate bus line of which part is removed and a mask layer covering the part as a mask.

In the embodiment, the semiconductor substrate 40 is a GaN substrate. However, the structure is not limited. For example, a SiC substrate, a Si substrate, a GaAs substrate or the like may be used as the semiconductor substrate 40. In the embodiment, the semiconductor layer 48 includes the i-type GaN layer 41, the n-type AlGaN layer 44 and the n-type GaN layer 46. However, the structure is not limited. The semiconductor layer 48 may be a group III-V compound semiconductor layer including a nitrogen, a group III-V compound semiconductor layer including arsenic or the like. For example, the III-V group compound semiconductor layer including nitrogen is, GaN, InN, AlN, AlGaN, InGaN, InAlN, AlInGaN or the like. For example, the III-V compound semiconductor layer including arsenic is GaAs, InAs, AlAs, InGaAs, AlGaAs, InAlGaAs or the like.

In the embodiment, the semiconductor device is a GaN-based FET. However, the structure is not limited. The semiconductor device may be a FET or a HEMT including the III-V group compound semiconductor including nitrogen. The semiconductor device may be a FET or a HEMT including the III-V group compound semiconductor including arsenic as in the case of a GaAs-based FET. In the case of the GaAs-based FET, the metal layer provided on the semiconductor layer can be formed by the following method. A WSi (tungsten silicide) layer having a thickness of 0.15 μm is deposited on a semiconductor layer by a sputtering method or the like. An Au layer having a thickness of 0.2 μm is deposited on the WSi layer by the sputtering method or the like. Thus, a metal layer including the WSi layer and the Au layer is formed on the semiconductor layer.

The present invention is not limited to the specifically disclosed embodiments and variations but may include other embodiments and variations without departing from the scope of the present invention.

What is claimed is:

1. A method for manufacturing a semiconductor device having a gate bus line which couples gate fingers of a plurality of FETs and gate pads comprising:
    forming a metal layer on a semiconductor layer;
    forming a first mask layer on the metal layer, the first mask layer not covering a first pattern for a first portion the gate bus line;
    forming a plated layer within the first pattern for the first portion of the gate bus line on the metal layer with use of the first mask layer as a mask;
    forming a second mask layer which covers a second pattern for a second portion of the gate bus line on the metal layer while exposing the plated layer, the second mask layer having a width, in a first direction orthogonal to a second direction in which the gate bus line extends, smaller than a width in the first direction of the plated layer formed within the first pattern for the first portion of the gate bus line, the second portion of the gate bus line being connected to the first portion of the gate bus line in the second direction; and
    etching the metal layer with use of the plated layer and the second mask layer as a mask so that the metal layer beneath the second mask layer becomes the second portion of the gate bus line, the second portion of the gate bus line having a smaller width in the first direction than the first portion of the gate bus line,
    wherein the second portion of the gate bus line is located between the gate pads.

2. The method as claimed in claim 1, wherein the second portion the gate bus line is located at a position from which electrical lengths to the gate pads are substantially equal to each other.

3. The method as claimed in claim 1, wherein the plated layer has a thickness of 1 μm to 2 μm.

4. The method as claimed in claim 1, wherein a Ni layer, a Pd layer and an Au layer are laminated in this order as the metal layer.

5. The method as claimed in claim 1, wherein:
    the metal layer is formed on a region constituting the gate fingers;
    the plated layer is formed so as to have a pattern of the gate fingers on the region constituting the gate fingers; and
    the region constituting the gate fingers is subjected to a patterning with use of the plated layer as a mask in the etching of the metal layer with use of the plated layer and the second mask layer as a mask.

6. The method as claimed in claim 1, wherein the plated layer is comprised of Au.

7. The method as claimed in claim 1, wherein the metal layer is comprised of a Ni layer, a Pd layer and an Au layer laminated in this order.

8. The method as claimed in claim 1, wherein the metal layer is comprised of a WSi layer and an Au layer laminated in this order.

9. The method as claimed in claim 1, wherein the semiconductor layer is comprised of a group III-V compound semiconductor layer including a nitrogen, or a group III-V compound semiconductor layer including arsenic.

* * * * *